United States Patent [19]
Cousy

[11] Patent Number: 6,003,390
[45] Date of Patent: Dec. 21, 1999

[54] TACTILE SENSOR, IN PARTICULAR FOR ELECTRICAL EQUIPMENT

[75] Inventor: Jean-Pierre Cousy, Limoges, France

[73] Assignees: Legrand; Legrand SNC, both of Limoges, France

[21] Appl. No.: 08/882,076

[22] Filed: Jun. 25, 1997

[30] Foreign Application Priority Data

Jul. 17, 1996 [FR] France ................................. 96 08939

[51] Int. Cl.⁶ ......................... H03K 17/96; H01L 41/08; G01L 1/16; G01L 5/22
[52] U.S. Cl. ......................... 73/865.7; 310/338; 310/339
[58] Field of Search ................... 73/865.7, 862, 73/625; 310/330, 338, 339

[56] References Cited

U.S. PATENT DOCUMENTS

| | | | |
|---|---|---|---|
| 4,328,441 | 5/1982 | Kroeger, Jr. et al. | 310/339 X |
| 4,430,595 | 2/1984 | Nakasone et al. | 310/339 |
| 4,634,917 | 1/1987 | Dvorsky et al. | 310/339 X |
| 4,705,923 | 11/1987 | Howell | 200/83 N X |
| 4,755,707 | 7/1988 | Nakaya et al. | 310/334 |
| 4,761,582 | 8/1988 | McKee | 310/339 X |
| 4,912,460 | 3/1990 | Chu | 310/330 X |
| 4,975,616 | 12/1990 | Park | 310/339 |
| 5,030,875 | 7/1991 | Krecht | 310/346 |
| 5,072,076 | 12/1991 | Camp, Jr. | 310/339 |
| 5,231,326 | 7/1993 | Echols | 310/339 |
| 5,266,863 | 11/1993 | Nonami et al. | 310/339 |

FOREIGN PATENT DOCUMENTS

| | | | |
|---|---|---|---|
| 0512124 | 11/1992 | European Pat. Off. | H01H 13/70 |
| 0553881 | 8/1993 | European Pat. Off. | H03K 17/96 |

OTHER PUBLICATIONS

EP000512124A1 "Keyboard" Nov. 11, 1992 Miller et al Abstract of EP 512124 via GPIC.

*Primary Examiner*—Thomas P. Noland
*Attorney, Agent, or Firm*—Young & Thompson

[57] ABSTRACT

A tactile sensor includes, under a control key accessible to the user, at least one piezo-electric member which is responsive through the control key to any depression of the latter. For connecting it to an electrical circuit of any kind, the piezo-electric member is sandwiched between a top or forward metal electrode to which it is attached and a bottom or rearward metal electrode which is attached to a support of any kind. For holding the piezo-electric member in place relative to the support of the bottom electrode, the top electrode is fixed to the support by at least one fixing point. Applications include controlling various devices such as on/off switches, changeover switches, dimmers or keypads.

19 Claims, 1 Drawing Sheet

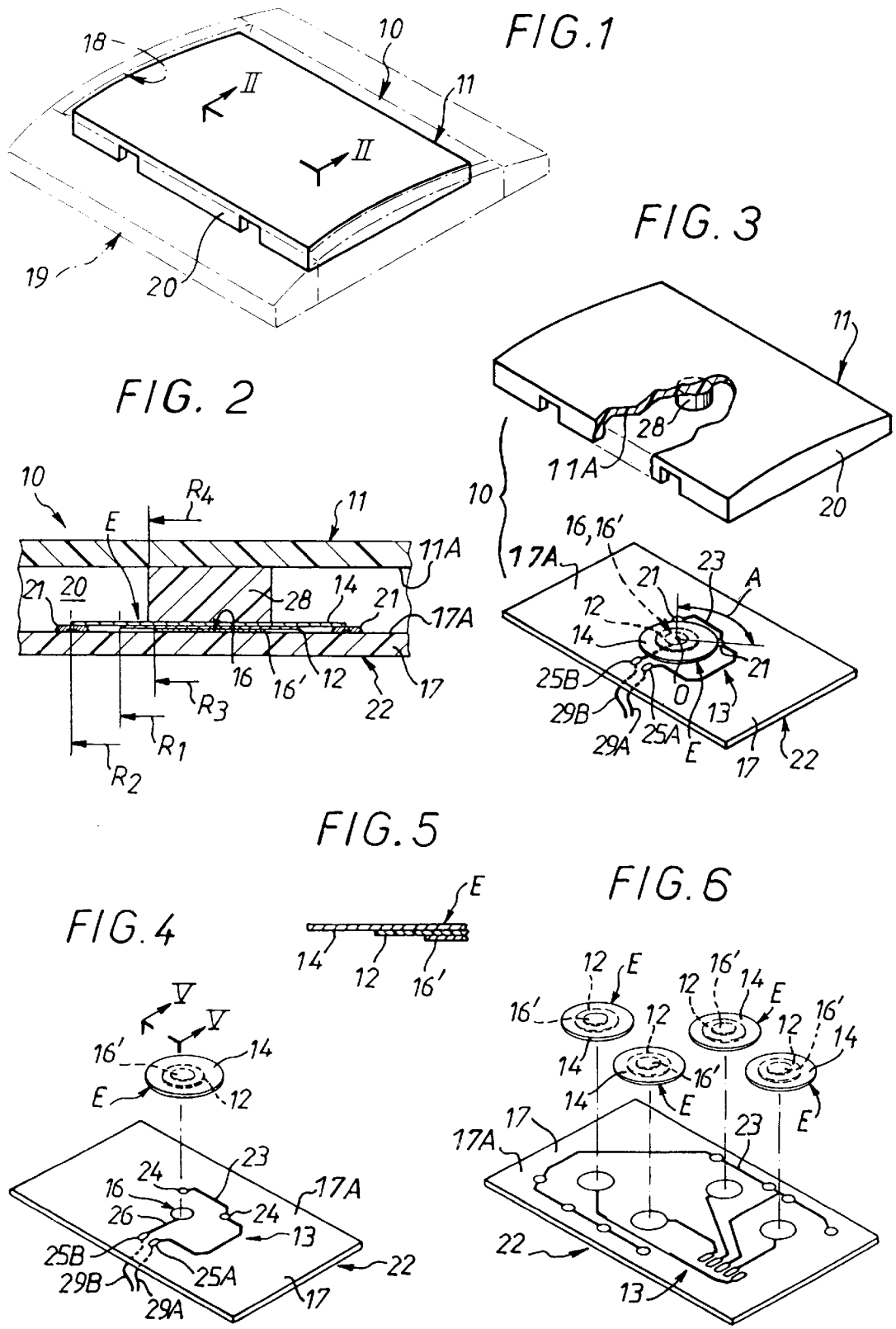

TACTILE SENSOR, IN PARTICULAR FOR ELECTRICAL EQUIPMENT

BACKGROUND OF THE INVENTION

1. Field of the Invention

The present invention is generally concerned with tactile sensors of the kind including at least one piezo-electric member under a control key accessible to the user and responsive to any depression of the control key by the user.

2. Description of the Prior Art

For example, tactile sensors of this kind constitute the control device or input device of certain devices, in particular certain electrical devices, such as on/off switches, changeover switches and dimmers.

They are also used in other devices, for example keypads.

The piezo-electric member is usually disposed between two metal electrodes which connect it to the electrical control circuit that it controls or, more generally, to an electrical circuit of any kind.

One of the problems encountered in the production of tactile sensors using a piezo-electric member of this kind is to hold it in position whilst leaving it sufficient freedom of movement to function.

In some implementations the piezo-electric member is mechanically located between its two electrodes, for example by placing it in a cavity in which it is duly peripherally confined.

However, implementations of this type usually involve the use of a non-negligible number of intermediate parts, to the detriment of efficiency and therefore of sensitivity.

In other implementations the electrodes are parts of conductive films between which the piezo-electric member must be inserted.

In practise, however, these implementations are subject to production engineering problems which usually lead to large overall size and/or high cost.

The present invention is more particularly directed to the situation in which the piezo-electric member is attached, for example glued, to one of the electrodes, referred to hereinafter for convenience only as the top electrode or forward electrode, while the other electrode, referred to hereinafter for convenience only as the bottom electrode, or rearward electrode, is attached to a support of any kind, for example the substrate of a printed circuit of any kind.

A general aim of the present invention is to provide an arrangement which, in this case, provides a simple and effective means of holding the piezo-electric member in place without compromising its effectiveness, and which also procures other advantages.

SUMMARY OF THE INVENTION

To be more precise, the present invention consists in a tactile sensor of the kind including, under a control key accessible to the user, at least one piezo-electric member which is responsive through the control key to any depression of the latter and which, for connecting it to an electrical circuit of any kind, is sandwiched between two metal electrodes, namely a top or forward electrode to which it is attached and a bottom or rearward electrode which is attached to a support of any kind, wherein, for holding the piezo-electric member in place relative to the support of the bottom electrode, the top electrode is fixed to the support by at least one fixing point.

Tests have confirmed that it is possible to assure a positive connection between the electrode carrying this piezo-electric member and a support, without the piezo-electric member being constrained in a manner that reduces its effectiveness to a degree that is unacceptable. This goes against received wisdom in the art, given the need for some freedom of movement of the piezo-electric member.

For example, the fixing point(s) used in accordance with the invention can advantageously be simple beads of solder, and this is preferably the case when the support of the bottom electrode is the substrate of a printed circuit.

These solder beads advantageously provide a mechanical connection that holds the top electrode and through this top electrode the piezo-electric member, in place relative to the support, and also the electrical connection(s) that the top electrode must provide.

The number of fixing points employed is preferably small.

From this point of view, in accordance with the invention, the use of just two fixing points constitutes a particularly advantageous compromise between adequate retention of the piezo-electric member relative to the support of the bottom electrode and sufficient freedom of movement of the piezo-electric member for it to operate effectively.

The sensitivity obtained is found to be optimal if the angle subtended by the fixing points at the center of the piezo-electric member equal to 90°.

Because of this sensitivity, and therefore thanks to the arrangement in accordance with the invention, it is advantageously possible to use an off the shelf piezo-electric member, which is of economic benefit, and the material of the control key can be a quality material such as wood or glass, for example, which cannot normally be used for a control key of this kind because of its relative fragility.

The control key of the tactile sensor of the invention can advantageously be actuated by merely touching it, rather than actually depressing it.

Finally, if the support of the bottom electrode is the substrate of a printed circuit, the bottom electrode constitutes one of the conductive tracks, in which case the printed circuit can advantageously be simple so that production engineering the unit as a whole is particularly easy.

The features and advantages of the invention will emerge from the following description given by way of example with reference to the accompanying diagrammatic drawings.

BRIEF DESCRIPTION OF THE DRAWINGS

FIG. 1 is a perspective view of a tactile sensor of the invention.

FIG. 2 is a fragmentary view of it in longitudinal section taken along the line II—II in FIG. 1 and to a larger scale.

FIG. 3 is a locally cut-away exploded perspective view of it.

FIG. 4 is an exploded perspective view of some components of the tactile sensor.

FIG. 5 is a fragmentary cross-sectional view of one of these components taken along the line V—V in FIG. 4 and to a larger scale.

FIG. 6 is an exploded perspective view similar to that of FIG. 4 and showing another tactile sensor of the invention.

DETAILED DESCRIPTION OF THE PREFERRED EMBODIMENTS

These figures show, by way of example, the application of the invention to a tactile sensor 10 for controlling a light dimmer, not shown.

In a manner that is known in itself, the tactile sensor 10 includes, under a control key 11 accessible to the user, at least one piezo-electric member 12 which is responsive to any depression or touching of the control key 11 and which is sandwiched between two metal electrodes 14, 16 for connecting it to an electrical circuit 13 of any kind, namely an electrode 14 referred to hereinafter for convenience only as the top electrode, the forward electrode to which it is attached, for example glued, and an electrode 16 referred to hereinafter for convenience only as the bottom electrode, or the rearward electrode, and which is attached to a support 17 of any kind.

In the embodiments shown the control key 11 has a rectangular contour in plan view and is accommodated in a housing 18 defined by an embellisher 19 shown schematically in chain-dotted line in FIG. 1 which forms a frame and which also has a rectangular contour in plan view.

As shown here, for example, the control key 11 is slightly domed and has an upstanding rim 20 at its edge.

In the embodiment shown in FIGS. 1 through 4 there is only one piezo-electric member 12.

It is a circular contour ceramic disk.

O is its center and R1 its radius.

A piezo-electric member 12 of this kind being well known in itself and not being relevant in itself to the present invention, it will not be described in detail here.

The top or forward electrode 14 that the piezo-electric member 12 carries projects beyond the edge of the latter, at least locally.

In the embodiments shown, the top electrode 14 is also a circular contour disk.

Coaxial with the piezo-electric member 12, and having a radius R2 greater than that R1 of the latter, it projects beyond the piezo-electric member 12 all around its periphery.

In the embodiments shown, the piezo-electric member 12 also carries a bottom-face or rear-face electrode 16' which is glued to it, for example.

Like the top electrode 14, this electrode 16' is a circular contour disk.

In the embodiments shown its radius R3 is less than that R1 of the piezo-electric member 12.

It is therefore set back relative to the latter at all points, which prevents any interference with the top electrode 14.

With the electrodes 14 and 16' on either side of it, the piezo-electric member forms a unitary subassembly E.

In accordance with the invention, to hold the piezo-electric member 12 in place relative to the support 17 for the bottom rearward electrode 16, the top or forward electrode 14 is fixed to the support 17 by at least one fixing point 21.

In the embodiments shown, the support 17 is generally flat and has a forwardmost surface 17A facing the underside 11A of the control key. Additionally the support 17 is the substrate of a printed circuit 22 the conductive tracks of which form the electrical circuit 13 and the fixing point 21 is a solder bead, to be more precise a solder bead between the top or forward electrode 14 and a conductive track 23 of the printed circuit 22 forming part of the electrical circuit 13.

Thus the fixing point 21 advantageously also constitutes an electrical connection.

As shown here, for example, the fixing point 21 is at the periphery of the top electrode 14 and the conductive track 23 includes a localized enlargement 24 in corresponding relationship, if required, for the solder to adhere to, as can be seen more clearly in FIG. 4.

However, this enlargement 24 is not obligatory. Its function is to facilitate conformance to the distances to be complied with.

As shown here, there are preferably two spaced fixing points 21 of the same type and each formed by a solder bead.

To be more precise, there are preferably only two fixing points 21 and the angle at the center A subtended by these two fixing points 21 at the center O of the piezo-electric member 12 is preferably equal to 90° (FIG. 3).

Apart from this angle A at the center, the location of the two fixing points 21 about the center O of the piezo-electric member 12 is immaterial.

In the embodiment shown, the two fixing points 21 have in common the conductive track 23 on the support 17, the conductive track 23 having two spaced localized enlargements 24 in corresponding relationship.

In the embodiments shown the bottom or rearward electrode 16 is also formed by a conductive track of the printed circuit 22 forming part of the electrical circuit 13.

As shown here, for example, it has a circular contour coaxial with the top or forward electrode 14 and its radius R3 is substantially equal to that of the electrode 16', for example.

The top or forward electrode 14 is connected to a first terminal 25A by the fixing points 21 and by the conductive track 23.

The rearface electrode 16' bears on, and is therefore in electrical contact with, the bottom or rearward electrode 16 which is connected by a conductive track 26 to a second terminal 25B near the terminal 25A.

In the embodiment shown, a spacer 28 is provided between the control key 11 and the top or forward electrode 14 to focus onto the top electrode 14 and thus onto the piezo-electric member 12 any depression or touching of the control key 11, even if this depression or touching is off-center.

The spacer 28 is glued to the underside 11A of the control key 11, for example, but could equally well be in one piece with the control key 11, for example molded in one piece with it, and is globally cylindrical and coaxial with the piezo-electric member 12 and the top and bottom electrodes 14 and 16. It has a circular cross-section the radius R4 of which is in the same order of magnitude as that R1 of the piezo-electric member 12.

As shown here, for example, this radius R4 is less than the radius R1 of the piezo-electric member 12 but slightly greater than that R3 of the electrode 16' and the bottom electrode 16.

The cross-sectional area of the spacer 28 is very much less than the surface area of the control key 11.

Constituting the substrate of the printed circuit 22, the support 17 is in practise in the form of a board having a rectangular contour complementary to that of the control key 11.

It is nested inside the upstanding rim 20 of the control key 11, bearing against lugs, not visible in the figures, which are in one piece with the control key 11, for example, and locate the support 17 relative to the control key 11 and attach it to the latter. The height of the spacer 28 is determined accordingly.

Thus the tactile sensor 10 of the invention may advantageously be in the form of a unitary assembly.

It is connected to the dimmer it controls by electrical conductors 29A, 29B connected to the output terminals 25A, 25B through the support 17.

In the embodiment shown in FIG. 5, which also relates to controlling a dimmer, a plurality of piezo-electric members 12 are provided, individually assigned to different functions, for example.

As the corresponding arrangements are not relevant to the present invention they will not be described here.

Note, however, that the same conductive track 23 on the support 17 is connected to the top electrodes 14 of the various piezo-electric members 12.

The present invention is naturally not limited to the embodiments described and shown, but encompasses any variant execution and/or combination of their various components, in particular with regard to the contour of the various electrodes employed.

In particular, if the piezo-electric member carries a bottom-face or rearface electrode, as described and shown, the bottom or rearward electrode may for example have any contour and can be merely a straight segment of conductive track, integrated with the printed circuit on the substrate.

Moreover, the fixing point(s) of the electrode carrying the piezo-electric member can be beads of glue, in particular if this electrode is connected to the electrical circuit it serves by a floating conductive wire.

There is claimed:

1. A tactile sensor control member comprising a button or key adapted to be pushed or touched, a piezo-electric member responsive to pushing or touching of the key or button, a forward and a rearward metal electrode spaced from each other, said piezo-electric member being sandwiched between the electrodes, the forward electrode having a forward surface fixed to an underside of said key or button, said forward electrode also being fixed to a support member by at least one fixing point for holding said piezo-electric member relative to said support member, and said piezo-electric member being disposed forwardly of said support member.

2. The tactile sensor control member claimed in claim 1, wherein said rearward electrode is affixed to a forwardmost surface of support member.

3. The tactile sensor control member claimed in claim 1, wherein said support member is a flat member.

4. The tactile sensor control member claimed in claim 1, wherein said support member comprises the substrate of a printed circuit.

5. The tactile sensor claimed in claim 1, wherein said at least one fixing point comprises a bead of solder.

6. The tactile sensor claimed in claim 5, wherein said fixing point defines an electrical connection.

7. The tactile sensor claimed in claim 5, wherein said support member comprises a substrate of a printed circuit, said fixing point being a solder bead between said forward electrode and a conductive path of said printed circuit.

8. The tactile sensor claimed in claim 7, wherein said rearward electrode is connected to a conductive path of said printed circuit.

9. The tactile sensor claimed in claim 1, Wherein said fixing point is disposed at a peripheral position on said forward electrode.

10. The tactile sensor claimed in claim 1, wherein there are two said fixing points.

11. The tactile sensor claimed in claim 10, wherein said two fixing points subtend an angle of 90° at the center of said piezo-electric member.

12. The tactile sensor claimed in claim 1, wherein there are only two said fixing points.

13. The tactile sensor claimed in claim 1, wherein said piezo-electric member carries a rear face electrode, said rear face electrode bearing on said rearward electrode and being in electrical contact therewith.

14. The tactile sensor claimed in claim 1, wherein said piezo-electric member has a periphery and said forward electrode projects beyond the periphery of said piezo-electric member at least locally.

15. The tactile sensor claimed in claim 1, wherein the underside of the key or button includes a rearwardly projecting spacer, said projecting spacer carrying said forward electrode.

16. The tactile sensor claimed in claim 15, wherein said spacer has a cross-sectional area substantially less than the area of the underside of said key or button.

17. A tactile sensor control member comprising a control key or button, comprising a piezo-electric member responsive to pushing or touching of the key or button, a support member facing said key or button and a space defined between said support member and said control key or button, said piezo-electric member being sandwiched between first and second opposed electrodes, said first electrode being supported by said control key or button, said second of the electrodes being fixed to said support member for holding said piezo-electric member in position relative thereto, said first electrode being also being fixed to said support member by at least one fixing point, said piezo-electric member being disposed in said space between said support member and said key or button.

18. The tactile sensor control member as claimed in claim 17, wherein said first and second electrodes are also disposed in said space between said key or button and said support member.

19. The tactile sensor control member as claimed in claim 17, wherein said support member has a generally flat forwardmost surface including conductive portions, said generally flat forwardmost surface facing the control button or key, said second electrode and said fixing point being fixed to said generally flat forwardmost surface.

* * * * *